(12) United States Patent
Tang

(10) Patent No.: US 11,894,846 B2
(45) Date of Patent: Feb. 6, 2024

(54) AUTONOMOUS DUTY CYCLE CALIBRATION

(71) Applicant: Lodestar Licensing Group LLC, Evanston, IL (US)

(72) Inventor: Qiang Tang, Cupertino, CA (US)

(*) Notice: Subject to any disclaimer, the term of this patent is extended or adjusted under 35 U.S.C. 154(b) by 0 days.

(21) Appl. No.: 17/075,462

(22) Filed: Oct. 20, 2020

(65) Prior Publication Data

US 2021/0036690 A1 Feb. 4, 2021

Related U.S. Application Data

(63) Continuation of application No. 15/966,889, filed on Apr. 30, 2018, now Pat. No. 10,833,656.

(51) Int. Cl.
*H03K 3/017* (2006.01)
*G11C 7/22* (2006.01)

(52) U.S. Cl.
CPC ............. *H03K 3/017* (2013.01); *G11C 7/222* (2013.01)

(58) Field of Classification Search
None
See application file for complete search history.

(56) References Cited

U.S. PATENT DOCUMENTS

| | | | |
|---|---|---|---|
| 6,356,218 B1 | 3/2002 | Brown et al. | |
| 7,142,028 B2 | 11/2006 | Chun | |
| 7,423,467 B1 | 9/2008 | Simon | |
| 7,525,358 B1 | 4/2009 | Taft et al. | |

(Continued)

FOREIGN PATENT DOCUMENTS

| | | |
|---|---|---|
| CN | 102739199 A | 10/2012 |
| CN | 103107808 A | 5/2013 |

(Continued)

OTHER PUBLICATIONS

KR Patent Application No. 10-2020-7020732—Korean Office Action and Search Report, dated Jul. 13, 2021, with English Translation, 12 pages.

(Continued)

*Primary Examiner* — Thomas J. Hiltunen
*Assistant Examiner* — Khareem E Almo
(74) *Attorney, Agent, or Firm* — Holland & Hart LLP

(57) ABSTRACT

Several embodiments of electrical circuit devices and systems with clock distortion calibration circuitry are disclosed herein. In one embodiment, an electrical circuit device includes clock distortion calibration circuitry to calibrate a clock signal. The clock distortion calibration circuitry is configured to determine when one or more duty cycle calibration (DCC) conditions are met. When the DCC condition(s) are met, the clock distortion calibration circuitry is configured adjust a trim value associated with at least one of first and second duty cycles of first and second voltage signals, respectively. In some embodiments, the clock distortion calibration circuitry is configured to calibrate at least one of the first and the second duty cycles of the first and the second voltage signals using the adjusted trim value to account for duty cycle distortion encountered across various voltages and/or temperatures while the electrical circuit devices and/or systems remain in a powered on state.

20 Claims, 4 Drawing Sheets

(56) References Cited

U.S. PATENT DOCUMENTS

| | | | |
|---|---|---|---|
| 8,063,910 B2* | 11/2011 | Swic | G09G 5/001 |
| | | | 345/534 |
| 8,314,642 B2 | 11/2012 | Kurokawa | |
| 8,650,357 B2* | 2/2014 | Lord | G06F 3/067 |
| | | | 711/E12.001 |
| 9,030,244 B1 | 5/2015 | Luo et al. | |
| 9,219,470 B1 | 12/2015 | Venditti | |
| 9,237,001 B1 | 1/2016 | Song et al. | |
| 9,390,770 B2* | 7/2016 | Venkata | G11C 7/08 |
| 9,954,517 B2* | 4/2018 | Ma | H03K 5/1565 |
| 10,097,169 B1 | 10/2018 | Pan et al. | |
| 10,181,844 B1 | 1/2019 | Fu | |
| 10,256,854 B1 | 4/2019 | Srinivasan et al. | |
| 10,270,429 B1* | 4/2019 | Wang | G11C 7/222 |
| 10,270,471 B2* | 4/2019 | Lu | H03M 13/1575 |
| 10,437,472 B2* | 10/2019 | Bhuiyan | G11C 29/028 |
| 10,447,247 B1* | 10/2019 | Tang | H03K 5/1565 |
| 10,547,298 B1 | 1/2020 | Mekky et al. | |
| 10,587,247 B2* | 3/2020 | Tang | H03K 3/017 |
| 10,727,816 B2 | 7/2020 | Wang et al. | |
| 11,309,876 B2* | 4/2022 | Doppalapudi | H04J 3/062 |
| 2005/0058233 A1 | 3/2005 | Nguyen et al. | |
| 2005/0074076 A1 | 4/2005 | Chen et al. | |
| 2005/0122149 A1 | 6/2005 | Cho et al. | |
| 2005/0184780 A1 | 8/2005 | Chun | |
| 2005/0184781 A1 | 8/2005 | Nagasue | |
| 2007/0013361 A1* | 1/2007 | Burlak | H03K 17/0822 |
| | | | 324/142 |
| 2007/0146011 A1* | 6/2007 | O'Mahony | H03K 5/156 |
| | | | 326/93 |
| 2007/0159224 A1 | 7/2007 | Dwarka et al. | |
| 2011/0156684 A1 | 6/2011 | Da et al. | |
| 2012/0280732 A1 | 11/2012 | Roytman et al. | |
| 2013/0285726 A1 | 10/2013 | Roytman et al. | |
| 2014/0368240 A1* | 12/2014 | Shelton | H03K 17/107 |
| | | | 327/109 |
| 2015/0171834 A1 | 6/2015 | Arp et al. | |
| 2015/0171836 A1 | 6/2015 | Lee | |
| 2015/0326215 A1* | 11/2015 | Snook | H03K 17/0822 |
| | | | 327/427 |
| 2017/0033774 A1* | 2/2017 | Hedayati | G06F 1/04 |
| 2017/0053684 A1 | 2/2017 | Choi | |
| 2017/0126069 A1* | 5/2017 | Martin | H03K 7/08 |
| 2018/0175834 A1 | 6/2018 | Modi et al. | |
| 2019/0190501 A1 | 6/2019 | Wang et al. | |
| 2019/0227867 A1* | 7/2019 | Ellur | H03M 13/098 |
| 2019/0229712 A1* | 7/2019 | Suzuki | H03K 5/1565 |
| 2019/0334508 A1* | 10/2019 | Tang | H03K 3/017 |
| 2020/0220528 A1 | 7/2020 | Koh et al. | |
| 2020/0336135 A1 | 10/2020 | Wang et al. | |
| 2021/0036690 A1* | 2/2021 | Tang | G11C 29/023 |

FOREIGN PATENT DOCUMENTS

| | | |
|---|---|---|
| CN | 106656123 A | 5/2017 |
| CN | 107850918 A | 3/2018 |
| KR | 20050083423 A | 8/2005 |
| KR | 100843002 B1 | 7/2008 |
| TW | I326981 B | 7/2010 |
| WO | 2017157026 A1 | 9/2017 |

OTHER PUBLICATIONS

International Application No. PCT/US2018/060647—International Search Report and Written Opinion, dated Mar. 11, 2019, 12 pages.
TW Patent Application No. 107142014—Taiwanese Office Action and Search Report, dated May 22, 2019, with English Translation, 11 pages.
Chinese patent office, "China Notice of Allowance," issued in connection with China Patent Application No. 201910352372.3 dated Oct. 24, 2023 (4 pages).

* cited by examiner

AUTONOMOUS DUTY CYCLE CALIBRATION

CROSS-REFERENCE TO RELATED APPLICATIONS

This application is a continuation of U.S. application Ser. No. 15/966,889, filed Apr. 30, 2018; which is incorporated herein by reference in its entirety.

TECHNICAL FIELD

The disclosed embodiments relate to electrical circuit devices and systems, and, in particular, to electrical circuit devices with autonomous duty cycle calibration capability.

BACKGROUND

Clock signals are used to coordinate actions of electrical circuits in electrical circuit devices. In some devices, these signals can be single-ended clock signals where a signal is transmitted by a voltage and is referenced to a fixed potential (e.g., a ground node). In such devices, one conductor carries the clock signal while another conductor carries the reference potential. Other electrical circuit devices can use a differential clock signal that employs two complementary (e.g., inverse) voltage signals to transmit one information signal. A receiver in such devices extracts information by detecting the potential difference between the complementary voltage signals. Each complementary voltage signal is carried by its own conductor, which means that differential-signaling often requires more wires than single-ended signaling and, thus, more space. Despite this disadvantage, differential signaling has many benefits over single-ended signaling. For example, because the two voltage signals have equal amplitude and opposite polarity relative to a common-mode voltage, return currents and electromagnetic interference generated by each signal are balanced and cancel each other out, which is an advantage especially noticeable at high frequencies. This, in turn, also reduces crosstalk to other nearby signals. In addition, electromagnetic interference or crosstalk introduced by outside sources is often added to each voltage signal, so the magnitude of the interference or crosstalk is reduced when a receiver takes a potential difference between the two signals. Furthermore, differential signaling provides a more straightforward logic state determination procedure, allows for more precise timing, and maintains an adequate signal-to-noise ratio at lower voltages. Even so, neither type of clock signaling is immune to duty cycle distortion.

A duty cycle of a clock signal is a ratio of the pulse time of the clock signal to its cycle period. A duty cycle of a clock signal can become distorted due to a variety of sources, including amplifiers that make up a clock tree, large propagation distances between amplifier stages of the clock tree, and/or parasitic conductor capacitance. Distortion of the duty cycle skews timing margins defined by the clock signal in electrical circuit devices. As a result, an electrical circuit using the distorted clock signal can have smaller timing windows in which to transfer and/or process data, which could lead to reduced pulse widths, data errors, and unreliable circuit performance. As input/output speeds increase (e.g., as the cycles of a clock signal are reduced), it also becomes increasingly more challenging to reduce duty cycle distortion, meaning that the consequences of duty cycle distortion at high input/output speeds are even more apparent. In addition, electrical circuits at different locations (e.g., on different electrical circuit dies) can experience varying degrees of duty cycle distortion of a clock signal due to differing sources of distortion located along the corresponding clock branches of a clock tree that define the clock signal pathways. Thus, it is desirable to mitigate duty cycle distortion of a clock signal at points along the clock signal pathways closest to electrical circuits, especially as input/output speeds increase.

DETAILED DESCRIPTION

Embodiments described herein relate to electrical circuit devices and related systems that employ clock distortion calibration circuitry. Such structures are shown, for example, in co-pending U.S. patent application Ser. No. 15/848,796 assigned to Micron Technology, Inc., which is incorporated herein by reference in its entirety.

As described in greater detail below, the present technology relates to electrical circuit devices and related systems having autonomous duty cycle calibration capability. A person skilled in the art, however, will understand that the technology may have additional embodiments and that the technology may be practiced without several of the details of the embodiments described below with reference to FIGS. 1-4. In the illustrated embodiments below, the electrical circuit devices are primarily described in the context of semiconductor devices having one or more semiconductor dies that use a differential clock signal (e.g., NAND storage media). Electrical circuit devices configured in accordance with other embodiments of the present technology, however, can include other types of structures, storage media, and/or clock signals. For example, electrical circuit devices in accordance with other embodiments of the present technology can comprise metamaterials; can include NOR, PCM, RRAM, MRAM, read only memory (ROM), erasable programmable ROM (EROM), electrically erasable programmable ROM (EEPROM), ferroelectric memory, and other storage media, including volatile storage media; and/or can use a single-ended clock signal.

One embodiment of the present technology is an electrical circuit device (e.g., a semiconductor device) that comprises clock distortion calibration circuitry and that utilizes a clock signal (e.g., a differential clock signal). The clock distortion calibration circuitry is configured to determine when one or more duty cycle calibration (DCC) conditions are met. When the DCC condition(s) are met, the clock distortion calibration circuitry is configured adjust (e.g., automatically and/or as a background operation of the electrical circuit device) a trim value associated with at least one of first and second duty cycles of first and second voltage signals, respectively. Using the adjusted trim value, the clock distortion calibration circuitry can calibrate at least one of the first and the second duty cycles of the first and the second voltage signals, respectively, of the clock signal. In this manner, the clock distortion calibration circuitry can account for duty cycle distortion encountered across various voltages and/or temperatures while the electrical circuit devices and/or systems remain in a powered on state. Furthermore, by only adjusting the trim value when the one or more DCC conditions are met, the electrical circuit device ensures the validity of resulting DCC calibration trim values, thereby justifying consumption of processing and/or channel input/output time and/or resources.

Figure 1:
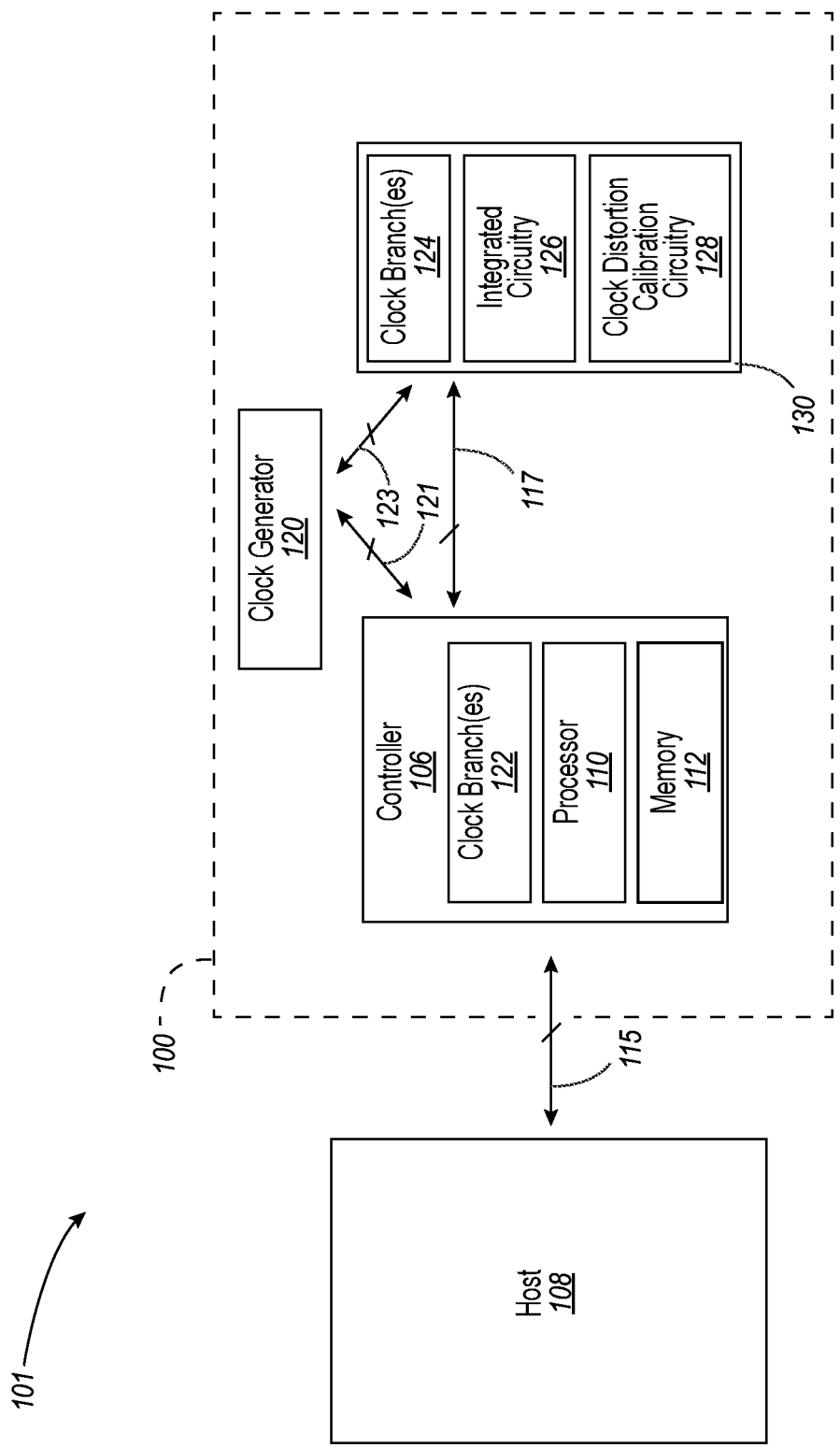
FIG. 1 is a block diagram of a system having an electrical circuit device configured in accordance with an embodiment of the present technology.

FIG. 1 is a block diagram of a system 101 having an electrical circuit device 100 (e.g., a semiconductor device and/or package) configured in accordance with an embodiment of the present technology. As shown, the electrical circuit device 100 includes a clock generator 120, an electrical circuit die 130 (e.g., a semiconductor die), and a controller 106 operably coupling the electrical circuit die 130 to a host device 108 (e.g., an upstream central processor (CPU)). Although illustrated separately from the controller 106 and the clock generator 120 in FIG. 1, the electrical circuit die 130 can comprise the controller 106 and/or the clock generator 120 in some embodiments. Furthermore, in other embodiments, the electrical circuit device 100 can include a plurality of electrical circuit dies 130, which can be vertically stacked (e.g., vertically connected with through-silicon vias (TSVs)) and arranged in a single device package. In still other embodiments, the electrical circuit device 100 can include a plurality of dies 130 distributed across multiple device packages and/or spread out along a single carrier substrate.

The clock generator 120 produces a clock signal (not shown) that is used to coordinate actions of electrical circuits within the electrical circuit device 100. The clock generator 120 transmits the clock signal to various components of the electrical circuit device 100 via a clock tree (partially shown). For example, in the embodiment illustrated in FIG. 1, the clock generator 120 sends the clock signal to the controller 106 via a first clock branch 121 of the clock tree. Similarly, the clock generator 120 sends the clock signal to the electrical circuit die 130 via a second clock branch 123 of the clock tree. As shown, the controller 106 and the electrical circuit die 130 include further clock branches of the clock tree (e.g., clock branch(es) 122 and clock branch(es) 124, respectively), which, in turn, distribute the clock signal to other electrical circuits located on the controller 106 and/or on the electrical circuit dies 130, respectively. In some embodiments, the clock generator 120 can be located on the electrical circuit die 130. In other embodiments including a plurality of electrical circuit dies 130, the clock generator 120 can be located on a dedicated electrical circuit die of the plurality of dies 130 or can be distributed across multiple electrical circuit dies of the plurality of dies 130. In still other embodiments, an electrical circuit device 100 may not include a clock generator 120 or may include only a portion of the clock generator 120. For example, the electrical circuit device 100 may instead rely upon an externally supplied clock signal (e.g., provided by an external host, or by a processor or controller separate from the electrical circuit device). In other embodiments, the clock signal can be partially generated and/or partially supplied externally and partially generated and/or partially supplied by circuitry located on the electrical circuit device 100.

The controller 106 can be a microcontroller, special purpose logic circuitry (e.g., a field programmable gate array (FPGA), an application specific integrated circuit (ASIC), etc.), or other suitable processor. The controller 106 can include a processor 110 configured to execute instructions stored in memory. In the illustrated example, the controller 106 also includes an embedded memory 112 configured to store various processes, logic flows, and routines for controlling operation of the electrical circuit device 100, including managing the electrical circuit die 130 and handling communications between the electrical circuit die 130 and the host device 108. In some embodiments, the embedded memory 112 can include memory registers storing, e.g., memory pointers, fetched data, etc. The embedded memory 112 can also include read-only memory (ROM) for storing micro-code. While the exemplary electrical circuit device 100 illustrated in FIG. 1 includes a controller 106, in another embodiment of the present technology, an electrical circuit device may not include the controller 106, and may instead rely upon external control (e.g., provided by an external host, or by a processor or controller separate from the electrical circuit device). In still other embodiments with a plurality of electrical circuit dies 130, the controller 106 can be integrated onto an individual electrical circuit die of the plurality of dies 130 or can be distributed across multiple electrical circuit dies of the plurality of dies 130.

The controller 106 communicates with the host device 108 over a host-device interface 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

In operation, the controller 106 can communicate with (e.g., read, write, erase, or otherwise communicate (e.g., transfer to or request from)) one or more integrated circuits 126 located on the electrical circuit die 130 over a communication line 117 (e.g., a data bus) in accordance with a clock signal generated by the clock signal generator 120. For example, in an embodiment in which integrated circuit 126 is a memory array, the controller 106 can read from and/or write to groups of memory pages and/or memory blocks of a memory region on the electrical circuit die 130.

The one or more integrated circuits 126 on the electrical circuit die 130 can be configured to operate as memory regions (e.g., NAND memory regions), logic gates, timers, counters, latches, shift registers, microcontrollers, microprocessors, field programmable gate arrays (FPGAs), sensors, and/or other integrated circuitry. The electrical circuit die 130 can also include other circuit components, such as multiplexers, decoders, buffers, read/write drivers, address registers, data out/data in registers, etc., for accessing and/or processing data and other functionality, such as programming memory cells of a memory region and/or communicating with the controller 106 (e.g., over communication line 117).

As discussed above, a clock signal (e.g., a single-ended or differential clock signal) is generated by the clock generator 120 and sent to various components of the electrical circuit device 100 to coordinate actions of electrical circuits (e.g., the controller 106 and/or the one or more integrated circuits 126 on the electrical circuit die 130) and/or components of the electrical circuits within the electrical circuit device 100. In accordance with the clock signal, the electrical circuits within the electrical circuit device 100 can be configured to process and/or transfer data either once per full cycle (i.e., on the rising edge or the falling edge) of the clock signal or twice per full cycle (i.e., as in double data rate (DDR) clock structures—once on the rising edge and once on the falling edge) of the clock signal.

The clock signal can become distorted as it propagates through the clock tree of the electrical circuit device 100. Common sources for this distortion include amplifiers that make up the clock tree, large propagation distances between amplifier stages of the clock tree, and/or parasitic conductor capacitance of the branches of the clock tree. Distortion can be introduced by sources located within an electrical circuit die (e.g., the electrical circuit die 130) and/or by sources located external to the electrical circuit die. Thus, external and internal distortion can accumulate within an electrical circuit die such that each electrical circuit die can exhibit varying degrees of duty cycle distortion of the clock signal. As noted above, duty cycle distortion skews timing margins defined by the clock signal in electrical circuit devices. As a result, distortion of the duty cycle of a clock signal often results in electrical circuits of the electrical circuit device having smaller timing windows in which to process and/or transfer data, which could lead to reduced pulse widths, data errors, and unreliable circuit performance, especially as input/output speeds increase and the cycle of the clock signal is reduced. For example, in double data rate (DDR) clock structures where data is processed and/or transferred on both the rising edge and the falling edge of a clock signal, a 50% duty cycle is desired to allow equal timing margins for each transfer and/or process activation. However, distortion skews these timing margins, meaning that the electrical circuit device 100 has a smaller timing window in which to transfer and/or process data on one side of the clock signal cycle. Thus, it is desirable to mitigate duty cycle distortion within a clock signal, especially as input/output speeds increase.

Figure 2:
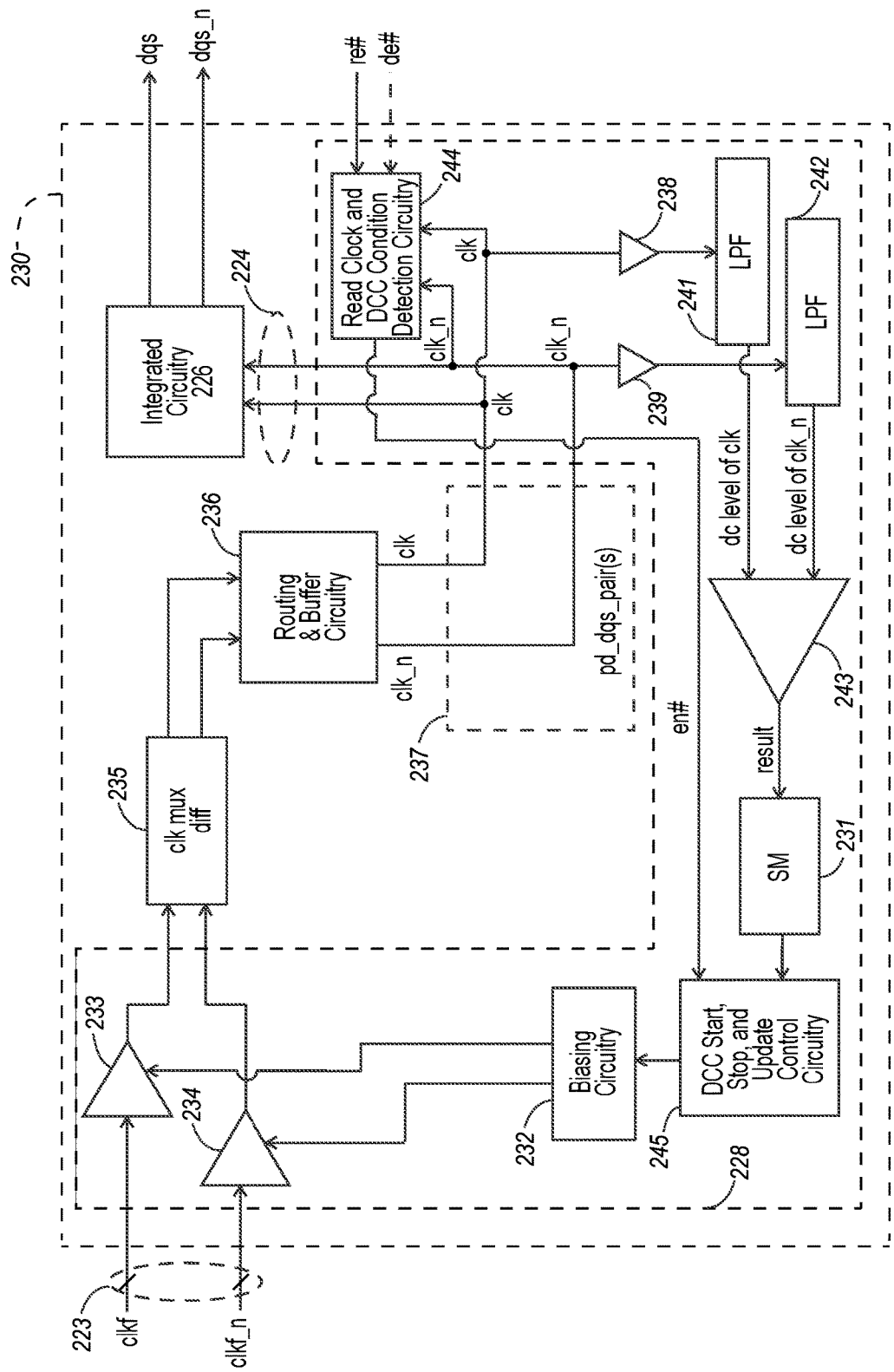
FIG. 2 is a block diagram of an electrical circuit die having clock distortion calibration circuitry in accordance with an embodiment of the present technology.
Figure 3:
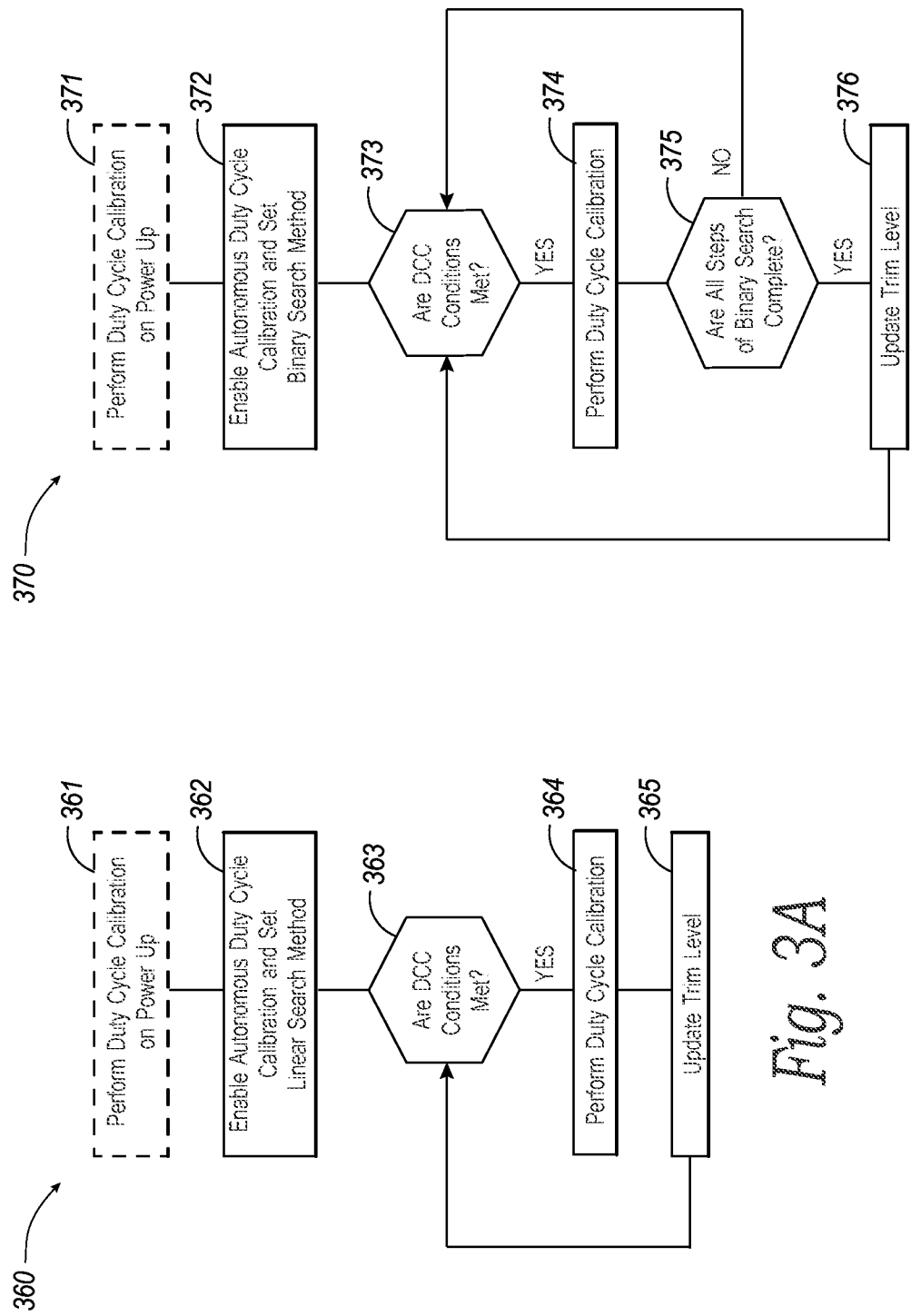
FIGS. 3A and 3B are flow diagrams illustrating methods of operating clock distortion calibration circuitry in accordance with embodiments of the present technology.

FIG. 2 is a block diagram of an electrical circuit die 230 (e.g., a semiconductor die) having clock distortion calibration circuitry 228 (e.g., clock distortion calibration circuitry 128 of FIG. 1) in accordance with an embodiment of the present technology. For example, the electrical circuit die 230 can be the electrical circuit die 130 illustrated in FIG. 1. As shown, the electrical circuit die 230 intakes an external differential clock signal via inputs clkf and clkf_n on clock branch 223 (e.g., clock branch 123 of FIG. 1) of a clock tree. Complementary voltage signals clkf and clkf_n are input through a respective input buffer 233 and 234, through a differential multiplexer 235, and through routing and buffer circuitry 236 of the electrical circuit die 230. At this point, complementary voltage signals clk and clk_n form one or more pd_dqs_pairs 237, which are routed to other integrated circuitry 226 (e.g., integrated circuitry 126 of FIG. 1) of the electrical circuit die 230 via clock branch(es) 224 (e.g., clock branch(es) 124 of FIG. 1) of the clock tree. In other words, this point represents a common point along the internal clock pathway of the electrical circuit die 230 that is a furthest distal point from the inputs clkf and clkf_n before the voltage signals clk and clk_n are branched in multiple directions to other integrated circuitry 226.

As illustrated in FIG. 2, the clock distortion calibration circuitry 228 can sample the complementary voltage signals clk and clk_n of the clock signal to calibrate the duty cycle of each voltage signal clk and clk_n. More specifically, the clock distortion calibration circuitry 228 passes the voltage signals clk and clk_n through respective low pass filters 241 and 242, which converts the voltage signals clk and clk_n to direct current (dc) level (e.g., analog level) representations of the duty cycles of the voltage signals clk and clk_n. The comparator 243 converts the dc level representations into digital signal representations, compares the digital signal representations, and provides one or more results of the comparison to the state machine 231. In some embodiments, the comparator 243 can compare one or both of the digital signal representations to other digital signal representations corresponding to other dc level representations (e.g., predetermined dc level representations) supplied to the comparator 243. The state machine 231 performs an algorithm (e.g., a bisectional sweep algorithm, a binary search, a linear or sequential search, etc.) to calculate and/or adjust (e.g., using a lookup table) one or more trim values (e.g., digital trim values), which are used to decrease the duty cycle of the voltage signal with the larger duty cycle and to increase the duty cycle of the voltage signal with the smaller duty cycle. The trim value(s) are passed to biasing circuitry 232, which converts the trim value(s) into biasing voltage(s) and/or biasing current(s) that are fed into the voltage signal clk and/or clk_n via corresponding input buffers 233 and 234.

In some embodiments, the electrical circuit die 230 is configured to perform duty cycle calibration (DCC) using the clock distortion calibration circuitry 228 when the electrical circuit die 230 is powered on. For example, the electrical circuit die can be configured to perform one or more iterations of DCC as part of a boot sequence of an electrical circuit device 100 containing the electrical circuit die 230. While the electrical circuit die 230 remains in a powered on state, however, the voltage of the clock signal and/or the temperature of the electrical circuit die 230 can vary over time. The varying voltages and temperatures can introduce additional distortion into the duty cycle of the clock signal (e.g., into the duty cycle of the complementary voltage signal clk and/or clk_n) that was not present when the electrical circuit die 230 was powered on. Thus, the adjusted trim value(s) calculated during the DCC iteration(s) performed while powering on the electrical circuit die 230 can become antiquated as the electrical circuit die 230 remains in the powered on state.

For this reason, the electrical circuit die 230 in some embodiments can perform additional iterations of DCC while the electrical circuit die 230 remains in the powered on state. For example, a host device 108 and/or a controller of the electrical circuit device 100 (e.g., controller 106) can direct the electrical circuit device 100 and/or the electrical circuit die 230 to perform one or more iterations of DCC after the electrical circuit device 100 and/or the electrical circuit die 230 is powered on. The corresponding commands and the additional iterations of DCC, however, consume processing time and/or resources of the host device 108, the electrical circuit device 100, the electrical circuit die 230, and/or the controller 106. Furthermore, these commands and/or additional iterations of DCC temporarily occupy the input/output channels on the electrical circuit device 100. Moreover, there is no guarantee that enough clock signal is available for the DCC operation(s) to obtain a meaningful calibration value, meaning that any processing time and/or resources used during the additional iteration(s) of DCC are wasted if a resulting calibration value is invalid.

To address this concern, the electrical circuit die 230 illustrated in FIG. 2 can additionally include read clock and DCC condition detection circuitry 244 ("detection circuitry 244") and DCC start, stop, and update control circuitry 245 ("update control circuitry 245") to facilitate autonomous DCC (e.g., as a background operation of the electrical circuit device 100 and/or of the electrical circuit die 230). As shown, the electrical circuit die 230 can be configured to input a read enable signal re# and complementary voltage signals clk and clk_n into the detection circuitry 244. The read enable signal re# can indicate to the detection circuitry 244 when the electrical circuit device 100 and/or the electrical circuit die 230 is in read mode (e.g., when the electrical circuit die 230 is performing a read operation). For example, a first state (e.g., a low or "0" state) of the read enable signal re# can indicate to the detection circuitry 244 that the electrical circuit device 100 and/or the electrical circuit die 230 is not in read mode, whereas a second state (e.g., a high or "1" state) of the read enable signal re# can indicate that the electrical circuit device 100 and/or the electrical circuit die 230 is in read mode.

In these and other embodiments, the electrical circuit die 230 can be configured to input an autonomous DCC enable signal de# into the detection circuitry 244 in addition to or in lieu of the read enable signal re#. The autonomous DCC enable signal de# can enable and disable autonomous DCC (e.g., when the DCC enable signal de# is in a first state and a second state, respectively). For example, the host device 108, the electrical circuit device 100, and/or the electrical circuit die 230 can enable and/or disable autonomous DCC through a set feature option or an MLBi option of the electrical circuit die 230 using the autonomous DCC enable signal de#. In some embodiments, the electrical circuit device 100 and/or the electrical circuit die 230 can disable short input/output pause operations while autonomous DCC is enabled to ensure the DCC calculates a valid calibration value.

In operation, the detection circuitry 244 can be configured to determine whether one or more DCC conditions are met. For example, the detection circuitry 244 can determine whether the electrical circuit device 100 and/or the electrical circuit die 230 is in read mode using the read enable signal re# and/or whether autonomous DCC is enabled using the autonomous DCC enable signal de#. In these and other embodiments, the detection circuitry 244 can determine whether enough of the clock signal (e.g., enough of the complementary voltage signal clk and clk_n) is available to perform an iteration of DCC and/or to produce a valid calibration value. For example, the detection circuitry 244 can determine whether there is a predetermined duration (e.g., 2 µs) of continuous read clocks. In these and still other embodiments, the detection circuitry 244 can determine whether there is a predetermined number of cycles (e.g., 2,000 cycles, 4,000 cycles, etc.) of continuous read clocks. If all or a subset of the DCC conditions are met, the detection circuitry 244 can be configured to indicate the DCC condition(s) are met via an enable signal en# output to the update control circuitry 245.

The update control circuitry 245 is configured to control the clock distortion calibration circuitry 228. For example, the update control circuitry 245 can be configured to pause, freeze, and/or stop DCC when the detection circuitry 244 indicates that one or more DCC conditions are not met (e.g., when the enable signal en# is in a first state). For example, the update control circuitry 245 can prevent the clock distortion calibration circuitry 228 from updating a calibration trim value if the read clock is interrupted (e.g., the electrical circuit device 100 and/or the electrical circuit die 230 exit read mode) such that one or more DCC conditions are not met. In these and other embodiments, the update control circuitry 245 can start an iteration of DCC and/or can permit the clock distortion calibration circuitry 228 to update the calibration trim value when the detection circuitry 244 indicates that the DCC condition(s) are met (e.g., when the enable signal en# is in a second state).

As described in greater detail below, the detection circuitry 244 and/or the update control circuitry 245 can direct the clock distortion calibration circuitry 228 to perform autonomous DCC as a background operation of the electrical circuit device 100 and/or of the electrical circuit die 230. For example, the detection circuitry 244 and/or the update control circuitry 245 can be configured to direct the clock distortion calibration circuitry 228 to perform an iteration of DCC and/or to update the calibration trim value while the electrical circuit device 100 and/or the electrical circuit die 230 is idle. In these and other embodiments, the detection circuitry 244 and/or the update control circuitry 245 can be configured to direct the clock distortion calibration circuitry 228 to perform an iteration of DCC and/or to update the calibration trim value while the electrical circuit device 100 and/or the electrical circuit die 230 are not in read mode and/or during other operations (e.g., during write operations) of the electrical circuit device 100 and/or of the electrical circuit die 230.

In this manner, electrical circuit devices 100 and/or electrical circuit dies 230 configured in accordance with embodiments of the present technology are configured to track and calibrate distortion in a clock signal (e.g., in complementary voltage signals clk and clk_n) across various voltages and/or temperatures while the electrical circuit devices 100 and/or the electrical circuit dies 230 remain in the powered on state. Furthermore, by enabling autonomous DCC, the electrical circuit devices 100 and/or electrical circuit dies 230 can perform DCC automatically and/or as background operations, thereby minimizing and/or eliminating consumption of processing and/or channel input/output time and/or resources required by additional DCC iterations and/or corresponding commands. Moreover, by only permitting additional DCC iterations and/or updates of the calibration trim value when one or more DCC conditions are met, the electrical circuit devices 100 and/or the electrical circuit dies 230 ensure the validity of resulting DCC calibration trim values, thereby justifying consumption of any processing and/or channel input/output time and/or resources by the additional iterations of DCC.

FIGS. 3A and 3B are flow diagrams illustrating a routine 360 and a routine 370, respectively, directed to methods of operating clock distortion calibration circuitry (e.g., clock distortion calibration circuitry 128 and/or 228) on an electrical circuit device (e.g., electrical circuit device 100) and/or on one or more electrical circuit dies (e.g., electrical circuit die 230) in accordance with embodiments of the present technology. Referring to FIGS. 3A and 3B together, the routines 360 and/or 370 can begin at blocks 361 and 371, respectively, to perform duty cycle calibration (DCC) upon powering on the electrical circuit device and/or dies. For example, the routines 360 and/or 370 can perform DCC as part of a boot sequence of the electrical circuit device.

Alternatively, the routines 360 and/or 370 can begin at blocks 362 and 372, respectively. At blocks 362 and 372, the routines 360 and 370, respectively, can enable autonomous DCC. In some embodiments, the routines 360 and 370 can automatically enable autonomous DCC (e.g., upon powering on the electrical circuit device and/or as part of a boot sequence of the electrical circuit device). In other embodiments, the routines 360 and/or 370 can enable autonomous DCC at the direction of an electrical circuit device controller (e.g., controller 106 of electrical circuit device 100), at the direction of an electrical circuit die controller (e.g., a controller located on electrical circuit dies 130 and/or 230), and/or at the direction of a host device (e.g., the host device 108). For example, the routines 360 and/or 370 can enable autonomous DCC at the direction of a command (e.g., a vendor specific (VS) command) received from the electrical circuit device controller, the electrical circuit die controller, and/or the host device. In these and other embodiments, the routines 360 and/or 370 can enable autonomous DCC through a set feature option and/or an MLBi option. In these and other embodiments, the routines 360 and/or 370 can disable short input/output pause operations while autonomous duty cycle calibration is enabled. At block 362 (FIG. 3A), the routine 360 sets linear (e.g., sequential) search as the search method of the autonomous DCC (e.g., in response to the command, the VS command, the set feature option selection, and/or the MLBi option selection). At block 372 (FIG. 3B), in contrast, the routine 370 sets binary search as the search method of the autonomous DCC (e.g., in response to the command, the VS command, the set feature option selection, and/or the MLBi option selection).

At blocks 363 and 373, the routines 360 and 370, respectively, determine whether autonomous DCC conditions are met at block 363. In some embodiments, the routines 360 and/or 370 can set the autonomous DCC conditions during manufacture and/or testing of the electrical circuit device. In these and other embodiments, the routines 360 and/or 370 can set and/or alter the autonomous DCC conditions in an end-user device (e.g., in response to a VS command). In some embodiments, one DCC condition can be a predetermined duration of continuous read clocks. For example, the routines 360 and/or 370 can use read clock and DCC detection circuitry of the clock distortion calibration circuitry to determine whether there is 2 µs of continuous read clocks. In these and other embodiments, an autonomous DCC condition can be a predetermined number of cycles of continuous read clocks. For example, the routine 360 and/or 370 can use the read clock and DCC detection circuitry to determine whether there has been at least 2,000 cycles of continuous read clocks. In these and still other embodiments, DCC conditions can be whether the electrical circuit device and/or the electrical circuit die are in read mode (e.g., as indicated by a read enable signal re#) and/or whether autonomous DCC is enabled (e.g., as indicated by an autonomous DCC enable signal de#).

If the routines 360 and/or 370 determine that one or more autonomous DCC conditions are met, the routines 360 and/or 370 can proceed to blocks 364 and 374, respectively, to perform duty cycle calibration. In some embodiments, the routines 360 and/or 370 can set whether all or a subset (e.g., one or more) of the autonomous DCC conditions must be met before the routines 360 and/or 370 can proceed to blocks 364 and/or 374, respectively. On the other hand, if the routines 360 and/or 370 determine that one or more autonomous DCC conditions have not been met, the routines 360 and/or 370 do not proceed blocks 364 and/or 374, respectively, but wait (e.g., pause or freeze the autonomous DCC) until the DCC conditions are met.

Referring to FIG. 3A, the routine 360 can perform one iteration of duty cycle calibration (DCC) using a linear search method. In some embodiments, the routine 360 can sample the duty cycle(s) of the clock signal (e.g., of complimentary voltage signals clk and clk_n) and can compare the duty cycle(s) to one another and/or to a value (e.g., a predetermined voltage value and/or a value equivalent to a 50% duty cycle). Based on the comparison, the routine 360 can proceed to block 365 to update a trim level (e.g., stored on a state machine of the clock distortion calibration circuitry). For example, the routine 360 can increment or decrement (e.g., a least significant bit of) the trim level based on a result of the comparison. In some embodiments, the routine 360 can update the trim level at block 365 each time the routine 360 performs duty cycle calibration at block 364.

In these and other embodiments, the routine 360 can perform duty cycle calibration (block 364) and/or update the trim level (block 365) as a background operation of the electrical circuit device. For example, the routine 360 can perform duty cycle calibration and/or update the trim value while the electrical circuit device is idle and/or outside of the active read time of the electrical circuit device. In this manner, the routine 360 does not consume processing time and/or resources (e.g., of the electrical circuit device controller) and does not consume channel input/output time (e.g., of the electrical circuit die). After the routine 360 performs one iteration of DCC (block 364) and updates the trim level (block 365), the routine 360 can return to block 363 to determine whether the DCC conditions are met such that the routine 360 can perform a next iteration of DCC.

Referring to FIG. 3B, the routine 370 can perform duty cycle calibration (DCC) to execute one step of a binary search method. In some embodiments, the routine 370 can sample the duty cycle(s) of the clock signal (e.g., of complimentary voltage signals clk and clk_n) and can compare the duty cycle(s) to one another and/or to a value (e.g., a predetermined voltage value and/or a value equivalent to a 50% duty cycle). Based on the comparison, the routine 370 can increment and/or decrement (e.g., a most significant bit of) a trim level (e.g., stored on a state machine of the clock distortion calibration circuitry).

In contrast with the routine 360, however, the routine 370 checks whether all steps of the binary search have been completed before proceeding to update the trim level at block 376. If the routine 370 determines that all steps of the binary search have not been completed, the routine 370 can return to block 373 to determine whether the DCC conditions are met such that the routine 370 can perform a next iteration of DCC as a next step of the binary search. On the other hand, if the routine 370 determines that all steps of the binary search have been completed, the routine 370 can proceed to block 376 to update the trim level (e.g., stored on the state machine). In some embodiments, the routine 370 can update the trim level one least significant bit at a time such that the trim level is updated over several update operations. In other embodiments, the routine 370 can update the trim level all at once in a single update operation.

Similar to the routine 360, the routine 370 can perform duty cycle calibration (block 374), can determine whether all steps of the binary search have been completed (block 375), and/or can update the trim level (block 376) as background operations of the electrical circuit device. For example, the routine 370 can perform duty cycle calibration, check whether all steps of the binary search are complete, and/or update the trim value while the electrical circuit device is idle and/or outside of the active read time of the electrical circuit device. In this manner, the routine 370 does not consume processing time and/or resources (e.g., of the electrical circuit device controller) and does not consume channel input/output time (e.g., of the electrical circuit die). After the routine 370 performs one iteration of DCC (block 374), determines that all steps of the binary search have been completed (block 375), and updates the trim level (block 376), the routine 370 can return to block 373 to determine whether the DCC conditions are met such that the routine 370 can perform a first step of a next binary search in a next iteration of DCC.

Although the steps of the routines 360 and 370 are discussed and illustrated in a particular order, the methods illustrated by the routines 360 and 370 in FIGS. 3A and 3B, respectively, are not so limited. In other embodiments, the methods can be performed in a different order. In these and other embodiments, any of the steps of the routines 360 and/or 370 can be performed before, during, and/or after any of the other steps of the routines 360 and/or 370. Moreover, a person of ordinary skill in the relevant art will readily recognize that the illustrated methods can be altered and still remain within these and other embodiments of the present technology. For example, one or more steps of the routines 360 and/or 370 illustrated in FIGS. 3A and 3B, respectively, can be omitted and/or repeated in some embodiments.

Figure 4:
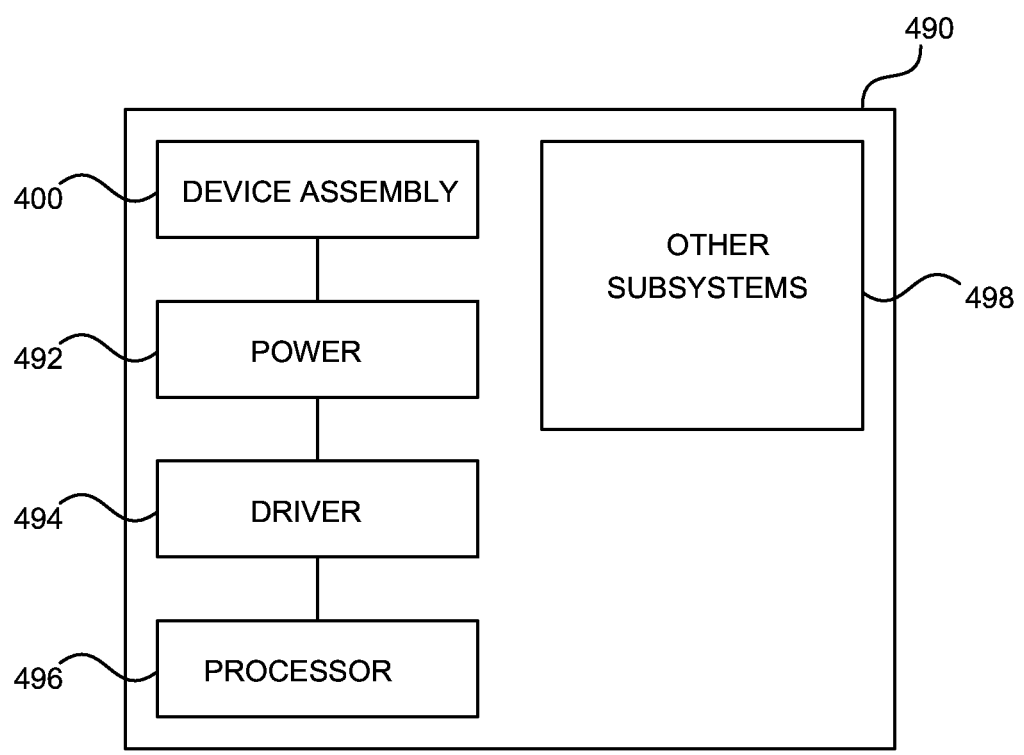
FIG. 4 is a schematic view of a system that includes an electrical circuit device in accordance with embodiments of the present technology.

FIG. 4 is a schematic view of a system 490 that includes an electrical circuit device in accordance with embodiments of the present technology. Any one of the foregoing electrical circuit devices described above with reference to FIGS. 1-3B can be incorporated into any of a myriad of larger and/or more complex systems, a representative example of which is the system 490 shown schematically in FIG. 4. The system 490 can include an electrical circuit device assembly 400, a power source 492, a driver 494, a processor 496, and/or other subsystems and components 498. The electrical circuit device assembly 400 can include features generally similar to those of the electrical circuit device described above with reference to FIGS. 1-3B, and can, therefore, include various features of clock distortion calibration. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, vehicles, appliances, and other products. Components of the system 490 may be housed in a single unit or distributed over multiple, interconnected units (e.g., through a communications network). The components of the system 490 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. A memory device comprising clock distortion calibration circuitry configured to:
   in response to determining that a duty cycle calibration (DCC) condition is met, execute a DCC operation to adjust a trim value associated with a duty cycle of a voltage signal, wherein the DCC condition comprises the memory device performing a data write operation and refraining from performing a data read operation based on receiving a command;
   while executing the DCC operation and after determining that the DCC condition is met, determine that the DCC condition is no longer met; and
   in response to the determination that the DCC condition is no longer met, interrupt the DCC operation before completing execution of the DCC operation such that the clock distortion calibration circuitry (i) does not adjust the trim value during the execution of the DCC operation or (ii) does not use an adjusted trim value, generated while executing the DCC operation, to calibrate the duty cycle of the voltage signal.

2. The memory device of claim 1, wherein, to interrupt the DCC operation, the clock distortion calibration circuitry is configured to pause or stop the DCC operation.

3. The memory device of claim 1, wherein the clock distortion calibration circuitry is configured to execute the DCC operation only when the DCC condition is met.

4. The memory device of claim 1, wherein the DCC condition further includes enablement of the clock distortion calibration circuitry to automatically execute the DCC operation in response to determining that the DCC condition is met.

5. The memory device of claim 1, wherein the DCC condition further includes enablement of the clock distortion calibration circuitry, via a set feature option or a media-local-bus interface (MLBi) option of the memory device, to automatically execute the DCC operation in response to determining that the DCC condition is met.

6. The memory device of claim 1, wherein the DCC condition further includes the memory device not being in read mode.

7. The memory device of claim 1, wherein the DCC condition further includes the memory device being in read mode.

8. The memory device of claim 1, wherein the DCC condition further includes an availability of a predetermined duration of continuous read clocks and an availability of a predetermined number of cycles of continuous read clocks.

9. The memory device of claim 1, wherein the DCC condition further includes the memory device being in an idle state.

10. A memory device, comprising:
clock distortion calibration circuitry including update control circuitry and detection circuitry operably connected to the control circuitry,
wherein the detection circuitry is configured to:
in response to determining that a duty cycle calibration (DCC) condition is met, set a DCC enable signal to a first state, wherein the DCC condition comprises the memory device performing a data write operation and refraining from performing a data read operation based on receiving a command; and
in response to determining that the DCC condition is not met, set the DCC enable signal to a second state different from the first state, and
wherein the update control circuitry is configured to:
in response to determining that the DCC enable signal is in the first state, enable the clock distortion calibration circuitry to execute a DCC operation to adjust a trim value associated with a duty cycle of a voltage signal; and
in response to determining that the DCC enable signal is in the second state while the clock distortion calibration circuitry is executing the DCC operation, disable the clock distortion calibration circuitry before execution of the DCC operation is completed such that the clock distortion calibration circuitry is disabled (i) from adjusting the trim value during the execution of the DCC operation or (ii) from using an adjusted trim value, generated during the execution of the DCC operation, to calibrate the duty cycle of the voltage signal.

11. The memory device of claim 10, wherein, to disable the clock distortion calibration circuitry, the update control circuitry is configured to interrupt the DCC operation.

12. The memory device of claim 10, wherein the update control circuitry is configured to enable the clock distortion calibration circuitry to execute the DCC operation only when the DCC enable signal is in the first state.

13. The memory device of claim 10, wherein the detection circuitry is further configured to:
detect a state of an autonomous DCC enable signal and of a read enable signal; and
set the DCC enable signal to the first state or to the second state based at least in part on the state of the autonomous DCC enable signal and on the state of the read enable signal.

14. The memory device of claim 10, wherein the DCC condition further includes:
an autonomous DCC enable signal input into the detection circuitry being in a third state;
a read enable signal input into the detection circuitry being in a fourth state;
the memory device not executing a data read operation;
the memory device executing a data write operation;
an availability of a predetermined duration of continuous read clocks;
an availability of a predetermined number of cycles of continuous read clocks; and
the memory device being in an idle state.

15. The memory device of claim 10, wherein the clock distortion calibration circuitry further includes:
a low pass filter configured to convert the voltage signal to a direct current (dc) level representation of the duty cycle of the voltage signal; and
a comparator configured to receive the dc level representation.

16. A memory device comprising clock distortion calibration circuitry configured to:
detect that a duty cycle calibration (DCC) condition is met, wherein the DCC condition comprises the memory device performing a data write operation and refraining from performing a data read operation based on receiving a command;
after detecting that the DCC condition is met and while executing a DCC operation to adjust a trim value associated with a duty cycle of a voltage signal, detect that the DCC condition is not met;
in response to detecting that the DCC condition is not met, disable the clock distortion calibration circuitry before execution of the DCC operation is complete such that the clock distortion calibration circuitry is disabled (a) from adjusting the trim value as part of the execution of the DCC operation or (b) from using a first adjusted trim value, generated during the execution of the DCC operation, to calibrate the duty cycle of the voltage signal;
after disabling the clock distortion calibration circuitry and while the clock distortion calibration circuitry is disabled, detect that the DCC condition is again met; and
in response to detecting that the DCC condition is met, enable the clock distortion calibration circuitry to execute another DCC operation (i) to adjust the trim value or (ii) to use a second adjusted trim value to calibrate the duty cycle of the voltage signal.

17. The memory device of claim 16, wherein the clock distortion calibration circuitry is further configured to adjust the trim value using a binary search and to calibrate the duty cycle of the voltage signal only when all steps of the binary search are complete.

18. The memory device of claim 16, wherein the clock distortion calibration circuitry is further configured to adjust the trim value using a linear search.

19. The memory device of claim 16, wherein the clock distortion calibration circuitry is further configured to calibrate the duty cycle of the voltage signal as a background operation of the memory device and while the memory device is idle.

20. The memory device of claim 1, wherein the DCC condition not being met indicates that continued execution of the DCC operation is unlikely to result in a valid adjusted trim value.

* * * * *